United States Patent [19]
Kosinski et al.

[11] Patent Number: 5,650,685
[45] Date of Patent: Jul. 22, 1997

[54] MICROCIRCUIT PACKAGE WITH INTEGRATED ACOUSTIC ISOLATOR

[75] Inventors: John A. Kosinski, Wall; Edward R. Baidy, Point Pleasant; Arthur Ballato, Oceanport; Owen P. Layden, Monmouth Beach, all of N.J.

[73] Assignee: The United States of America as represented by the Secretary of the Army, Washington, D.C.

[21] Appl. No.: 533,043

[22] Filed: Sep. 25, 1995

Related U.S. Application Data

[63] Continuation-in-part of Ser. No. 3,168, Jan. 12, 1993, which is a continuation-in-part of Ser. No. 828,071, Jan. 30, 1992, abandoned.

[51] Int. Cl.$^6$ ................................................ H01L 41/08
[52] U.S. Cl. .................... 310/316; 310/317; 310/318; 310/319; 310/311; 310/322; 310/334; 333/186
[58] Field of Search .................... 310/316–319, 310/311, 322, 334; 333/186–192

[56] References Cited

U.S. PATENT DOCUMENTS

| | | | |
|---|---|---|---|
| 3,174,122 | 3/1965 | Fowler et al. | 333/187 |
| 3,521,089 | 7/1970 | Stuetzer | 310/321 |
| 4,450,376 | 5/1984 | Meitzler | 310/334 |
| 4,798,990 | 1/1989 | Henoch | 310/334 |
| 4,864,179 | 9/1989 | Lapetina et al. | 310/334 |
| 5,034,753 | 7/1991 | Weber | 333/187 |
| 5,229,553 | 7/1993 | Lester et al. | 181/102 |

OTHER PUBLICATIONS

"Stacked Acoustic Filters for High Power Microwave Electromagnetic (HPM–EMI) Isolation" by J. Kosinski et al. Feb., 1991.
Research and Development Technical Report, SLC-ET–TR–91–6, US Army Laboratory Command.
Kosinski, J. & Baidy, E., "Stock Acoustic Filters for High Power Microwave Electromagnetic (HPM–EMI) Isolation", U.S. Army Laboratory Command, ETDL, R&D Technical Report; SLCET–TR–91–6, Feb. 1991.

*Primary Examiner*—Thomas M. Dougherty
*Attorney, Agent, or Firm*—Michael Zelenka; William H. Anderson

[57] ABSTRACT

A microcircuit package with an integrated acoustic isolator made up of a stacked acoustic filter. The package includes a rigid, electrically conductive housing with a IC module mounted therein. The acoustic filter includes two electroacoustic transducers mounted on opposite sides of a common wall of the package, one inside the package and the other outside. An a.c. power source is connected to the transducer that is mounted on the outside of the package. Electrical energy from the power source is converted by the outside transducer into acoustic energy which is conducted through the package wall to the inside transducer which reconverts the acoustic energy into electrical energy. The package wall has a significant thickness in comparison to the acoustic wavelength of the filter passband and is preferably equal to an integer number of one-half acoustic wavelengths. The transducer-wall combination acts as a filter having a passband tailored to prevent high-power microwave energy from being transmitted through the package wall.

4 Claims, 4 Drawing Sheets

POWER TRANSMISSION EFFICIENCY VS. MECHANICAL Q
OF TRANSDUCERS 41, 42

MICROCIRCUIT PACKAGE WITH INTEGRATED ACOUSTIC ISOLATOR

NOTICE OF CONTINUATION

The present application is a continuation-in-part of U.S. patent and Trademark Office application Ser. No. 08/003, 168, Attorney Docket No. 4897, filed Jan. 12, 1993, which is a continuation-in-part of U.S. patent and Trademark Office application Ser. No. 07/828,071, entitled MICROCIRCUIT PACKAGE WITH INTEGRATED ACOUSTIC ISOLATOR, inventors Kosinski et al, Attorney Docket no. CECOM 4658, filed Jan. 30, 1992, now abandoned.

GOVERNMENT INTEREST

The invention described herein may be manufactured, used, and licensed by or for the Government of the United States of America for governmental purposes without the payment to us of any royalty thereon.

FIELD OF THE INVENTION

This invention relates to microcircuit packages which isolate circuitry from high power microwave electromagnetic interference.

BACKGROUND OF THE INVENTION

Integrated circuits (IC) are typically enclosed in ceramic packages with metallic feed-throughs. Such devices, however, are susceptible to high-power microwave electromagnetic interference (HPM-EMI) since the microwaves readily penetrate the ceramic package and are picked up by package leads and interconnects when such lead lengths are of the same order of magnitude as the microwave wavelength. Thus, the interference of micro-circuits with HPM-EMI is a critical problem that confronts many designers of military equipment and other strategic systems.

For example, those concerned with the development of digital fly-by-wire systems have long recognized the need for isolating such systems from HPM-EMI. In such systems, the ceramic packages of conventional IC devices have been replaced by metallic packages to provide Faraday shielding, thereby directly eliminating absorbed HPM-EMI.

Electro-optic circuits including optical fiber have also been used to eliminate indirectly absorbed HPM-EMI picked up and transmitted along conventional metallic feed-throughs. However, such electro-optic isolators have limited power handling capabilities, thus precluding their use in isolating the power supply feedthroughs.

Further, spiral inductors formed on the IC chips near the power input pad have been used to partially isolate the digital portion of IC devices from HPM-EMI traveling along the power supply lines. This technique is relatively simple and may provide some isolation at long microwave wavelengths. Unfortunately, since the metallic feed-through is not eliminated, microwave isolation at short wavelengths will not be possible using this technique. This is because, at short wavelengths, HPM-EMI on the power supply lines will be re-radiated inside the package by the chip-to-package interconnect wires. Therefore, those skilled in the art of packaging military hardware would readily appreciate a microcircuit package which provides a high power feed through while still being resistant to HPM-EMI. The present invention addresses such a microcircuit package.

SUMMARY OF THE INVENTION

Accordingly, the first general purpose of this invention is to provide a microcircuit package with an integrated acoustic filter for transmitting electrical power across a Faraday shield wall without requiring a breach in the wall and thus providing HPM-EMI isolation. To attain this first general purpose, the present invention contemplates an acoustic filter which employs a pair of ceramic planar piezoelectric transducers, one being a driving piezoelectric transducer and the other a receiving piezoelectric transducer. The piezoelectric transducers are mounted directly to opposing surfaces of a Faraday shield wall with no opening in the wall, the ceramic piezoelectric transducers being held in place with epoxy or comparable means. The acoustic wave travels from the driving piezoelectric transducer, across the Faraday shield wall, and is received by the receiving piezoelectric transducer. A central feature of the present invention is that the Faraday shield wall interposed between the piezoelectric transducers be of a specific thickness, i.e., it must be less than the thickness of the wall and substantially equal to ½ wavelength of the acoustic wave emitted by the driving piezoelectric transducer, or an integer multiple thereof (1, 1½, 2, etc.). This principle concerning the ratio of transducer thickness to acoustic wavelength is based upon a monograph by John A. Kosinski and Edward R. Baidy, entitled Stacked Acoustic Filters for High Power Microwave Electromagnetic (HPM-EMI) Isolation, dated February 1991. Thus using these principles, the power source is connected to the input transducer such that only power at a predetermined frequency may be transmitted through the conductive wall. To further provide for HPM-EMI hardening, the present invention also includes a unique microcircuit package having d.c. to a.c. and a.c. to d.c. conversion circuity and a rigid, electrically conductive housing with a IC module mounted therein. A d.c. power source is connected to the d.c. to a.c. conversion circuity which is in turn connnected to the driving piezoelectric transducer mounted on the outside of the package. Electrical energy from the power source is converted to an a.c. signal which is coupled through the driving piezoelectric transducer to convert the a.c. signal to acoustic energy. The acoustic energy is then conducted through the package wall to the receiving piezoelectric transducer which reconverts the acoustic energy into electrical energy. The transducer-wall combination acts as a filter having a passband tailored to prevent high-power microwave energy from being transmitted through the package wall. A unique feature of this design is that with the planar transucer being mounted on a heavily loaded conductive barrier, there is no transverse propagation of the acoustic signal so there is no energy leakage through the package wall and accordingly, there is no need for an energy trapping means. This is true despite the fact the longitudinal mode of the acoustic wave, the mode passing through the conductive barrier, is unbounded.

It is another object of the invention to provide an acoustic filter that is easily manufactured from durable, inexpensive materials, thereby providing an HPM-EMI filter with lower fabrication cost than conventional EMI filters. A still further object is to provide an HPM-EMI isolator having a filter passband that is a function of the package geometry thereby allowing the invention to power integrated circuitry which requires higher power, such as Very High Speed Integrated Circuits (VHSIC). An additional object of the present invention is to provide an acoustic filter that can be readily miniaturized so as to be incorporated into standard electronic miniaturization packaging techniques, thereby providing HPM-EMI isolation at the package level of an electronic device.

BRIEF DESCRIPTION OF THE DRAWINGS

Other objects and many of the attendant advantages of this invention will be readily appreciated as the invention will become better understood by reference to the following detailed description when considered in connection with the accompanying drawings in which like reference numerals designate like parts throughout the figures thereof.

DETAILED DESCRIPTION OF THE PREFERRED EMBODIMENT

Figure 1:
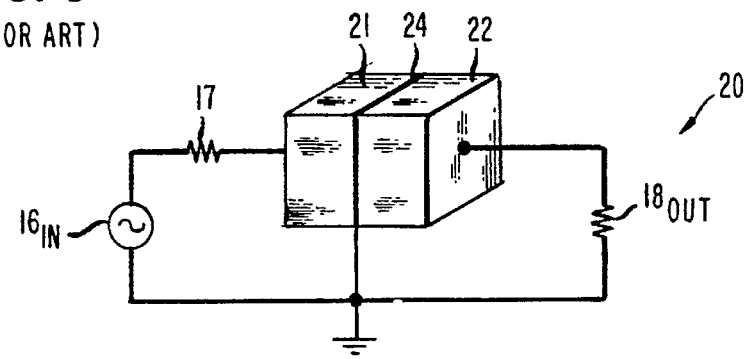
FIG. 1 is a pictorial view of a prior art device.

The generic principle utilized in the present invention will be more readily understood with reference to FIG. 1 which illustrates a prior art stacked acoustic structure 20 used as a simple electrical bandpass filter. Structure 20 includes two piezoelectric plates 21 and 22 on opposite sides of a thin grounded electrode 24. Plate 21, which is connected to an input signal source 16 and matching resistor 17, acts as an input transducer. Plate 22, which is connected to an output load 18, acts as an output transducer. The electrical input signal from source 16 is converted to an acoustic signal by piezoelectric plate 21. The acoustic signal is propagated across the electrode 24, which acts as a ground plane, to piezoelectric plate 22. The acoustic signal is then reconverted to an electrical output signal on load 18. A detailed description of the basic operation, structure and design methodology employing equivalent electrical circuits of stacked acoustic structures may be found in: A. Ballato, H. L. Bertoni, and T. Tamir, "Systematic Design of Stacked-Crystal Filters by Microwave Network Methods," IEEE Transactions on Microwave Theory and Techniques, Vol. MTT-22, No. 1, January 1974, pp. 14–25, referred to herein as Ballato I; and A. Ballato and T. Lukaszek, "A Novel Frequency Selective Device: The Stacked Crystal Filter," Proceedings of the 27th Annual Symposium on Frequency Control Symposium, May 1973, pp. 262–269, referred to herein as Ballato II, both of which are incorporated by reference.

Figure 6:
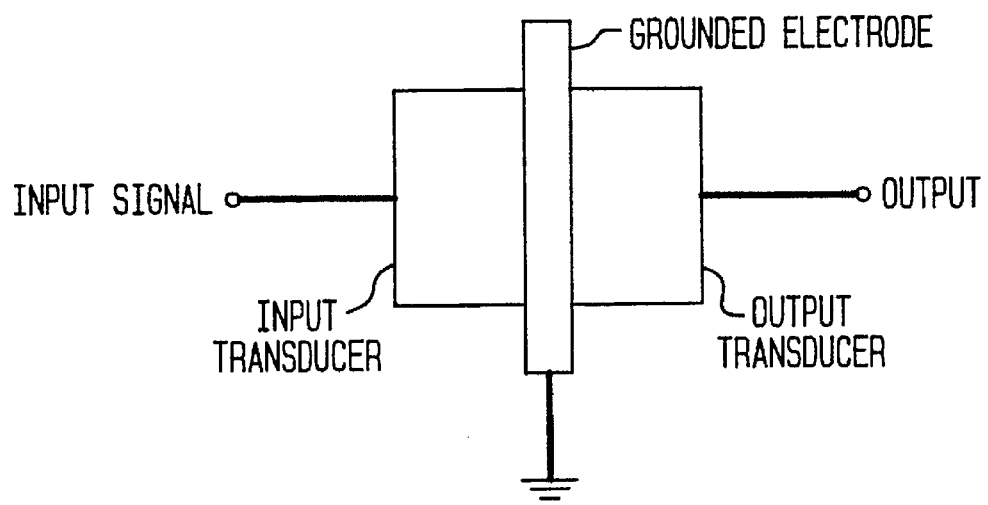
FIG. 6 is a schematic view of a prior art device.

A device which is also contemplated by Ballato I and II is illustrated in FIG. 6. Such a device is simply formed from two piezoelectric plates mechanically attached with an electrode along the interface which is connected to a ground. The electrical input signal is converted to an acoustic signal by the input transducer, and the acoustic signal is propagated across the ground plane to the output transducer which then reconverts the acoustic signal to electrical output signal.

Another example of such a stacked acoustic structure is described in U.S. Pat. No. 3,521,089 issued to O. Stuetzer on Jul. 21, 1970, which is also incorporated herein by reference.

Figure 2:
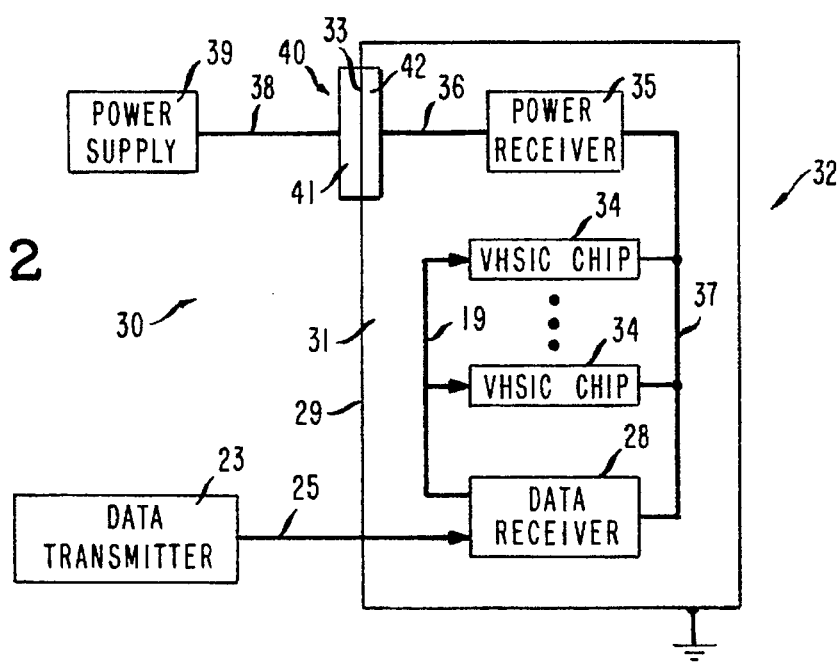
FIG. 2 is a schematic block diagram of the preferred embodiment of a microcircuit package having an HPM-EMI isolator in the power supply line and an electro-optical data link into the package.

The present invention improves upon this prior art device to form a HPM-EMI hardened microcircuit package by fabricating the piezoelectric plates 41 and 42 and Faraday wall 33 such that their thicknesses and widths constrain lateral energy propagation and by coupling a d.c. power source to the stacked acoustic filter via d.c. to a.c. conversion circuity. These improvements are illustrated in FIG. 2 in a schematic block diagram wherein there is shown an IC microcircuit assembly 30 having means for providing electroacoustic power transmission to the interior 31 of a package 32. The metallic walls 29 of package 32, which act as a Faraday shield, enclose the interior 31 and shield data receiver 28, IC chips 34, power receiver 35, the internal power bus 37, conductor 36, data bus 19 and any other microcircuit elements contained in package 32 to protect this circuitry from the direct absorption of HPM-EMI. A stacked acoustic filter 40 isolates the package 32 from indirect absorption of HPM-EMI while permitting power to be transmitted to the interior 31. Power supply 39 transmits power via conductor 38 to stacked acoustic filter 40, which is composed of a driving planar piezoelectric transducer 41, and a receiving planar piezoelectric transducer 42, mounted on either side of metallic Faraday shield wall 33, which is heavily loaded acoustically and which acts as a grounded center electrode and is also part of casing 50 (see FIG. 3). The driving piezoelectric transducer 41 and the receiving piezoelectric transducer 42, preferably fabricated from conventional highly efficient piezoelectric plates, are connected to power supply 39 via conductor 38 and power receiver 35 via conductor 36, respectively. Power supply 39 includes a conventional d.c. power source and d.c. to a.c. converter (not shown in FIG. 2) to produce a.c. power. The stacked filter 40 allows power at the desired frequency to pass through wall 33 to conductor 36 but attenuates signals at all other frequencies. The filtered power is transmitted to the power receiver 35 for conversion into d.c. via a diode rectifier or other suitable device. The power bus 37 distributes the d.c. power to the chips 34 and other circuit elements. Data transmission line 25, preferably made of optical fiber, extends from a data transmitter 23 into package 32. Conventional optical fiber can provide substantial HPM-EMI isolation in a manner known to those skilled in these arts. The data receiver 28 distributes the data to chips 34 via data bus 19.

Figure 3:
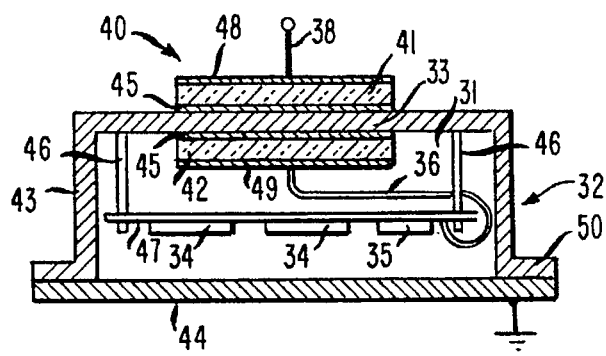
FIG. 3 is an elevation in cross-section taken along the line 3—3 of FIG. 4 in the direction of the arrows.
Figure 4:
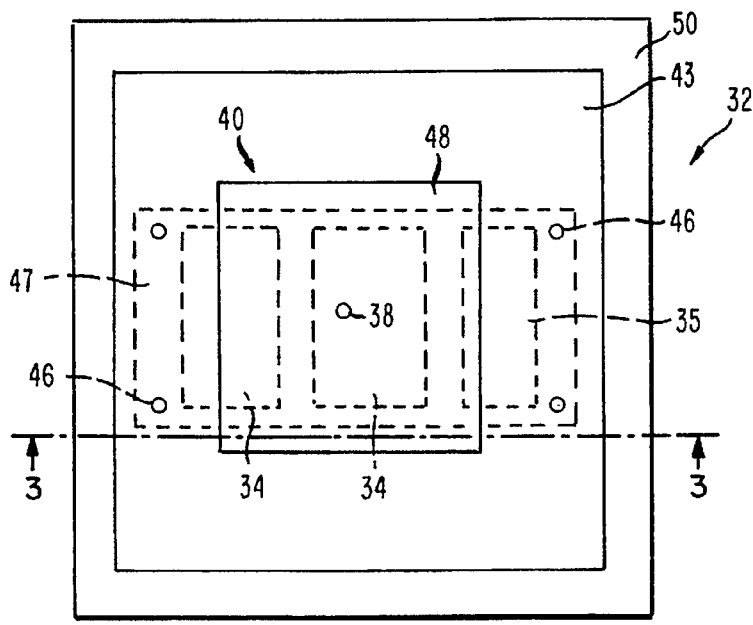
FIG. 4 is a top view of the preferred embodiment.

FIGS. 3 and 4 illustrate the preferred embodiment of microcircuit package 32 in greater structural detail. The package 32 is formed from an electrically conductive housing 43 and a conductive lid 44 (see FIG. 3). Housing 43 and lid 44 may be fabricated from metals such as silver (Ag), aluminum (Al), brass, copper (Cu), nickel (Ni) and steel. As shown in FIG. 3, the driving planar piezoelectric transducer 41 and the receiving planar piezoelectric transducer 42 are matched and are fixed to either side of housing 43 by bonding agent 45. The following adhesives have been found to be suitable for use as bonding agent 45: Cu-epoxy, Ag-epoxy; and 99.99% pure indium paste. This list is not exhaustive and other bonding agents may serve satisfactorily. A conductive electrode 48 on transducer 41 is connected to conductor 38. A conductive electrode 49 on the receiving piezoelectric transducer 42 is connected to conductor 36. High-Q ("hard") lead zirconate titanate (PZT) transducers are preferred for use as the driving planar piezoelectric transducer 41 and the receiving planar piezoelectric transducer 42. Standoff insulating posts 46, fixed to the inside surface of housing 43, mount a circuit board 47 in interior 31 of package 32. Chips 34 and receiver 35 are mounted on board 47 in a conventional manner. Conductor 36 is joined to an appropriate conductor (not shown) on board 47. The stacked acoustic filter 40 of FIG. 3 is composed of the following: driving planar piezoelectric transducer 41; receiving planar piezoelectric transducer 42; wall 33 of housing 43; and bonding agent 45. The important electrical properties of these filter elements and the package 32 include the insertion loss, the frequency response, and the Faraday shielding efficiency of the housing 43 and lid 44. The important acoustic aspects include the piezoelectric coupling of driving planar piezoelectric transducer 41 and receiving planar piezoelectric transducer 42, the acoustic attenuation in wall 33, and the acoustic impedance matching at the material interfaces of filter 40. The filter 40 acts as a bandpass filter characterized by such well-known parameters as center frequency, bandwidth, shape factor, insertion loss, out-of-band attenuation, input impedance and output impedance. Of course, as those skilled in the will readily recognize, center frequency, insertion loss and out-of-band attenuation are the parameters of particular importance for use in an HPM-EMI isolator. With respect to Faraday shielding electromagnetic radiation incident on the conductive housing 43 and lid 44 will penetrate the walls to an extent determined by the wall thickness, the frequency of the radiation and the physical properties of the wall material. The conversion of the electrical input power signal provided by power supply 39 into an acoustic wave, its propagation through the relatively thick wall 33, and its reconversion to an electrical signal at electrode 49 are accomplished as simply and efficiently as possible, thereby minimizing size, weight, and complexity penalties. The primary factors affecting the efficiency of acoustic power transmission in the present case will include the piezoelectric coupling of the driving planar piezoelectric transducer 41 and receiving planar piezoelectric transducer 42, the bonding of the driving planar piezoelectric transducer 41 and receiving planar piezoelectric transducer 42, the acoustic attenuation in wall 33 and the acoustic impedance mismatches at the boundaries between the various layers in the stacked filter 40. These factors are influenced by both material selection and stack configuration. The power handling capability of the stacked acoustic filter 40 is determined primarily by the material of the driving planar piezoelectric transducer 41 and receiving planar piezoelectric transducer 42, and the transducer-to-wall bonding technique. The frequency of operation of power supply 39 also plays a role in determining power handling capability. Implementation of the foregoing design considerations, the relationships between the physical properties of the constituent materials, and the various electrical and acoustic design parameters may be readily carried out by those skilled in these arts. These relationships may be modeled using well known principles such as the transmission line and filter theories described in Ballato I and II, cited above. Using the principles set forth in these or other publications, skilled artisans may generate an equivalent circuit model of filter 40 that accommodates arbitrary materials for the driving piezoelectric transducer 41, the receiving piezoelectric transducer 42, electrodes 48, 49, and the ground plane defined by wall 33 as well as various methods for attaching such including bonding agent 45.

A preferred procedure for fabricating a specific implementation of the package 32 follows:

a) Cut 2.54 cm×2.54 cm PZT plates into quarters using a K&S Model 775 wafer saw.

b) Burnish the PZT plate surfaces to remove any oxidation layer and degrease in 1-1-1 trichloroethane in an ultrasonic cleaner.

c) Screen print the adhesive 45 onto the PZT plates using a DeHaart Model AOL-15 screen printer. Best results are obtained with an 80 mesh screen.

d) Clamp the stacked filter 40 with an RSP Tool 2 Engineering #TC17 6895 Pa (1 lb/in$^2$) pressure sealing clamp.

e) Cure the adhesive 45 according to the manufacturer's recommended cure schedule. The epoxies and polyimides are cured in a drying oven while the indium is cured in a belt-type oven.

f) Attach conductors 36, 38 using a Hughes Model 550 split tip parallel gap welder.

The electroacoustic efficiency and power handling capability of the driving piezoelectric transducer 41 and the receiving piezoelectric transducer 42, are directly proportional to the piezoelectric coupling factor of the transducer material. This consideration leads to the use of high-coupling PZT piezoelectric ceramic as the preferred transducer material. Transducer structures with electroacoustic efficiency exceeding 90% have been reported. The important material properties of two PZT types which may be used to fabricate the driving piezoelectric transducer 41 and the receiving piezoelectric transducer 42, are listed in Table 1.

TABLE 1

Material Properties of PZT Ceramics

| PROPERTY | PLT TYPES | |
|---|---|---|
| | LTZ-2H | LTZ-5 |
| Free Dielectric Constant | 3400 | 500 |
| Loss Tangent | .015 | .007 |
| Density (kg/m) | 7450 | 600 |
| Coupling Coefficient | .75 | .63 |
| Mechanical Q | 70 | 700 |
| Longitudinal Wave Velocity (m/sec) | 3861 | 3886 |

Package 32 should preferably provide good electromagnetic shielding while at the same time promoting the propagation of the acoustic wave. The shielding efficiency depends on the electrical conductivity and magnetic permeability of the material, while the wave propagation depends on the material density, wave velocity, and acoustic attenuation. Table 2 lists these properties for suitable package materials.

TABLE 2

Properties of Suitable Materials for Package 32

| PROPERTY | Aq | Al | Brass | Cu | Kovar | Ni | Steel |
|---|---|---|---|---|---|---|---|
| Conductivity (×10$^6$ ohm/m) | 61 | 35 | 11 | 58 | 2 | 13 | 2 |
| Magnetic Permeability (×10$^{-6}$ H/m) | 1.3 | 1.3 | 1.3 | 1.3 | 130 | 63 | 400 |
| Density (kg/m$^3$) | 10500 | 2699 | 8600 | 8960 | 8329 | 8900 | 7850 |
| Longitudinal Wave Velocity (m/sec) | 3650 | 6420 | 4700 | 4760 | 4968 | 6040 | 5960 |
| Acoustic Attenuation (×10$^{-6}$ dB/m/Hz) | 3 | .4 | 6 | 11 | — | 1.5 | 1 |

A primary requirement for bonding agent 45 is obviously good adhesion between the wall 33 and both the driving piezoelectric transducer 41 and the receiving piezoelectric transducer 42. However, beyond this purely mechanical consideration, the acoustic behavior of bonding agent 45 is critical to obtain efficient acoustic wave propagation. Values of important parameters for preferred bonding agents 45 are listed in Table 3.

TABLE 3

Properties of Suitable Materials for Bonding Agent 45.

| PROPERTY | Epoxy | Polyamide | Indium |
|---|---|---|---|
| Density (kg/m³) | 1100 | 3190 | 7390 |
| Longitudinal Wave Velocity (m/sec) | 2600 | @300 | 2300 |
| Acoustic Attenuation (10⁻⁶ dB/m/HZ) | 200 | 33000 | 7.8 |

Power attenuation of incident microwave power by package 32 will be a function of its wall thickness and its material properties. Power attenuation ($\alpha p$) is defined as the ratio of the power (Pp) penetrating package 32 to the power (Pi) incident on the package 32 such that $$\alpha P = 10 \log_{10}(Pp/Pi) \quad (1)$$

where $\alpha p$ is in decibels (dB).

The field intensity attenuation (dE) is related to the power attenuation ($\alpha p$) as follows:

$$\alpha p = (\alpha E)^2 \quad (2)$$

The field intensity (dE) is attenuated exponentially based on the package material and package thickness (t) as $$\alpha E = e^{(-t/\delta)} \quad (3)$$

where ($\delta$) is the skin depth which depends on the frequency (f) of the incident radiation, the permeability ($\mu$) and conductivity ($\sigma$) of the material of package 32 as follows:

$$\delta = 1/(\pi f \mu \sigma)^{1/2} \quad (4)$$

The required thickness (t) for package 32 is therefore related to skin depth ($\delta$) and field intensity attenuation ($\alpha E$) as $$t = -\delta \ln(\alpha E) \quad (5)$$

The magnitude of $\ln(\alpha E)$ in equation (5) is independent of the material and is simply the number of skin depths required to meet the attenuation requirements. For 40 dB attenuation, 4.6 skin depths are required, while for 80 dB attenuation, 9.2 skin depths are required. Table 4 summarizes the minimum thickness (t) requirements for various materials of package 32 based on a lower frequency limit of 1 GHz.

TABLE 4

Skin Depth ($\delta$) and Minimum Package Thickness (t) at 1 GHz

| Material | $\delta$ | 40 dB thickness | 80 dB thickness |
|---|---|---|---|
| Ag | 2.03 µm | 0.009 mm | 0.019 mm |
| Al | 2.67 µm | 0.012 mm | 0.025 mm |
| Brass | 4.80 µm | 0.022 mm | 0.044 mm |
| Cu | 2.09 µm | 0.010 mm | 0.019 mm |
| Kovar | 1.11 µm | 0.005 mm | 0.010 mm |

TABLE 4-continued

Skin Depth ($\delta$) and Minimum Package Thickness (t) at 1 GHz

| Material | $\delta$ | 40 dB thickness | 80 dB thickness |
|---|---|---|---|
| Ni | 0.62 µm | 0.003 mm | 0.006 mm |
| Steel | 0.63 µm | 0.003 mm | 0.006 mm |

The acoustic filter 40 provides HPM-EMI attenuation while meeting efficiency and power handling requirements. In theory, the center frequency ($f_o$) of the acoustic filter 40 may be set at any frequency below 1 GHz. However, the internal dissipation of the transducer materials may limit efficient operation to the low megahertz range and below. The choice of filter center frequency ($f_o$) fixes the acoustic wavelength ($\lambda$) and is critical not only electrically but also acoustically.

The relationship between the filter center frequency ($f_o$) and the acoustic wavelength ($\lambda$) is given by $$\lambda = v/(f_o) \quad (6)$$

where (v) is the acoustic velocity. The wavelength ($\lambda$) is related to the propagation constant (k) as $$k = 2\pi/\lambda$$

Inasmuch as the wave velocity (v) is material dependent, the acoustic wavelength ($\lambda$) and propagation constant (k) will be different for the various layers in the stacked filter 40. In the kilohertz region, typical package thicknesses are only a small fraction of the acoustic wavelength ($\lambda$). At megahertz frequencies, the package thicknesses (t) are of the same order of magnitude as the acoustic wavelength ($\lambda$).

The acoustic impedance (Z) of a wave propagating in an arbitrary material may be calculated as $$Z = A\rho v$$

in which (A) represents the surface area normal to the direction of wave propagation and ($\rho$) is the material density. The acoustic admittance (Y) is simply (1/Z). The combination of acoustic impedance (Z) and propagation constant (k) serve to completely model the wave propagation in any layer. The acoustic impedance (Z) is often expressed in normalized form on a per unit area basis.

Results obtained using the Cu-epoxy, Ag-epoxy and indium paste for bonding agent 45 are listed in Table 5.

TABLE 5

Highest Observed Efficiency for Various Adhesives

| Adhesive | Insertion Loss (dB) | Efficiency (%) |
|---|---|---|
| Cu-epoxy | −4.70 | 34 |
| Ag-epoxy | −0.64 | 86 |
| Indium paste | −3.68 | 43 |

Transmission efficiency will be maximized when package thickness (t) is an integer number of half-wavelengths ($\lambda/2$) thick. This is readily seen from the equation describing the acoustic input impedance $Z_{in}$ of the package 32, $$Z_{in} = Z_p \left((Z_t + jZ_p \tan(kl))/(Z_p + jZ_t \tan(kl))\right) \quad (10)$$

wherein (Zp), (k), and (1) are the respective acoustic impedance, propagation constant, and thickness of the wall 33, and ($Z_r$) is the acoustic impedance of the receiving piezoelectric transducer 42. When the package thickness (t) is an integer multiple of half-wavelengths ($\lambda/2$), the tangent factors in Equation (10) are zero and ($Z_{in}$) is equal to ($Z_r$). Thus, the acoustic wave can propagate from the driving piezoelectric transducer 41 to the receiving piezoelectric transducer 42 with minimum reflection loss when this condition is met. This means that the transverse propagation losses, which one would normally expect to be present, are minimal and there is, therefore, no need for energy trapping. This was verified experimentally, and the results obtained for various package thicknesses are shown in Table 6.

TABLE 6

Experimental Results For Various Package Thicknesses (t)

| Adhesive | Insertion Loss (dB) | Efficiency (%) | Thickness |
|---|---|---|---|
| Cu-epoxy | 7.75 | 27 | ¼ |
|  | 4.70 | 34 | ½ |
|  | 7.94 | 16 | ¾ |
|  | 4.75 | 33 | 1 |
| Ag-epoxy | 4.80 | 33 | ¼ |
|  | 2.24 | 60 | ½ |
|  | 4.46 | 36 | ¾ |
|  | 2.27 | 59 | 1 |
| Indium paste | 14.38 | 4 | ¼ |
|  | 6.10 | 25 | ½ |
|  | 12.28 | 6 | ¾ |
|  | 6.40 | 23 | 1 |

Figure 5:
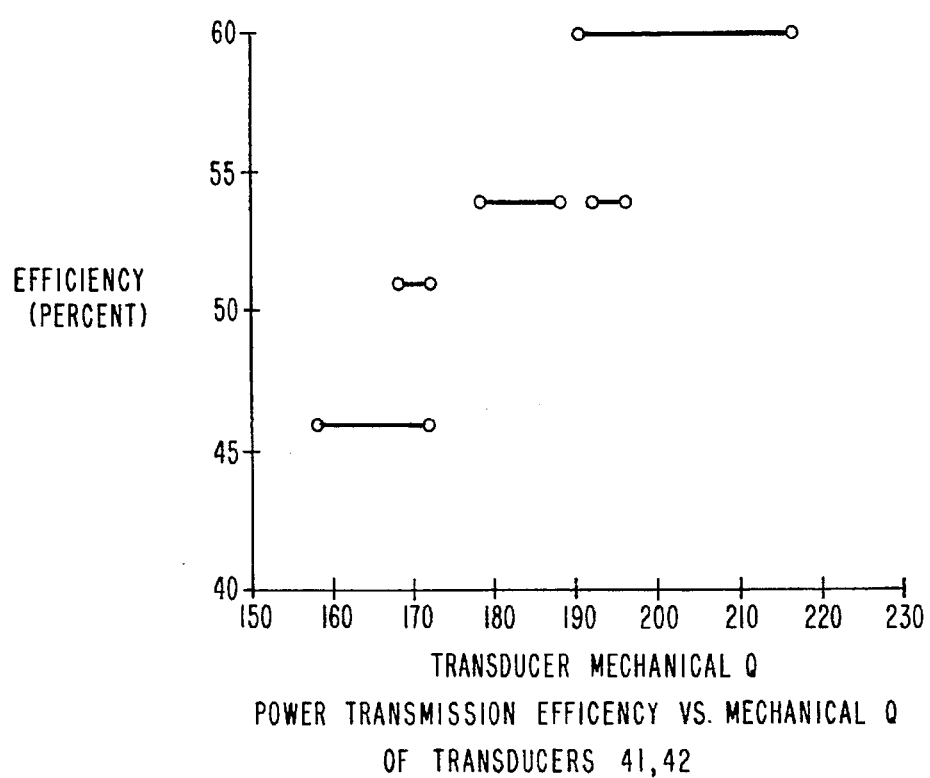
FIG. 5 is a graph of the relationship between mechanical Q and efficiency.

Two types of piezoceramic material known as "hard" (LTZ-5) and "soft" (LTZ-2H) PZT may be used for the driving piezoelectric transducer 41 and the receiving piezoelectric transducer 42. The difference, which is of note here, is the order of magnitude greater mechanical Q of the "hard" PZT as compared to the "soft" with respect to the energy dissipated per vibrational cycle, and, as such, the higher Q material would be expected to produce a lower loss stacked filter 40. This has been confirmed experimentally wherein structures fabricated with "hard" PZT yielded efficiencies of 32%–43% while similar structures fabricated with "soft" PZT yielded efficiencies of 6%–16%. The relationship between mechanical Q and efficiency is exemplified in FIG. 5, wherein efficiency is plotted as a function of transducer mechanical Q for a set of similarly stacked filters 40. As shown, each of the horizontal lines represents differing efficiencies given the mechanical Q of differing materials. Thus, it is shown the higher the mechanical Q, the better the efficiency is experienced. It is contemplated that the present invention has the following salient characteristics:

1. When wall 33 of package 32 is an integer multiple of half-acoustic wavelengths thick, a 3-pole bandpass filter response is achieved, as opposed to the two-pole response that is achieved with filter 20 having the thin electrode 24.

2. The acoustic filter passband width can be adjusted by making wall 33 an appropriate integer multiple of half-acoustic wavelengths thick.

3. The thickness (t) of the package 32 is sufficient to allow for it to be rigid and thickness must be larger than that of the planar driving and receiving piezoelectric transducers.

4. Longitudinal wave propagation may be used with no degradation due to air loading. Thus, no elaborate vacuum packaging for energy trapping is required.

5. Lateral wave propagation is a minimum, and the power handling capability is high, thus a small filter 40 that is mounted near the corner of a package 32 will suffice in many applications.

Figure 7:
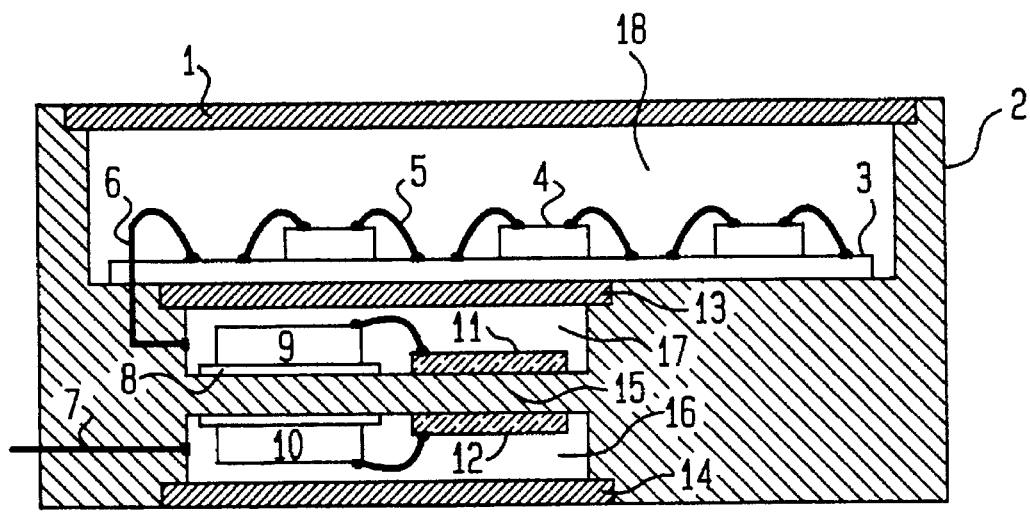
FIG. 7 is a diagram of an alternate embodiment of a microcircuit package having an HPM-EMI isolator in the power supply line.

Now referring to FIG. 7, there is shown an alternate embodiment of the present invention. FIG. 7 shows an Electromagnetic Interference (EMI) protected microcircuit package design. As shown, cavities 16, 17 and 18 are milled out inside metal package container 2 by milling from both the top and bottom of the package container 2, thus forming isolation wall 15. The wall 15 isolating the two cavities 16 and 17 is milled such that its thickness is an integer number of half acoustic wavelengths. PZT discs 11 and 12 are then bonded to this isolation wall 15 as shown. DC power is fed into the bottom isolation compartment through isolated pin 7 and gets converted to AC power by DC to AC conversion circuitry 10, which is mounted on another substrate 8. The AC power is applied to PZT transducer 12 and converted to acoustic power. The acoustic power then penetrates the isolation wall 15 of half acoustic wavelengths and impinges upon PZT transducer 11 which converts the acoustic power back to AC power. Rectification circuitry 9, which is mounted on a subtrate 8, converts the acoustic power back to usable DC power which reaches the microcircuit substrate 3 via isolated pin 6 and is distributed on the substrate power lines 5 to chips 4. The entire metal package is then hermetically sealed with metal lids 1, 13, and 14.

Figure 8:
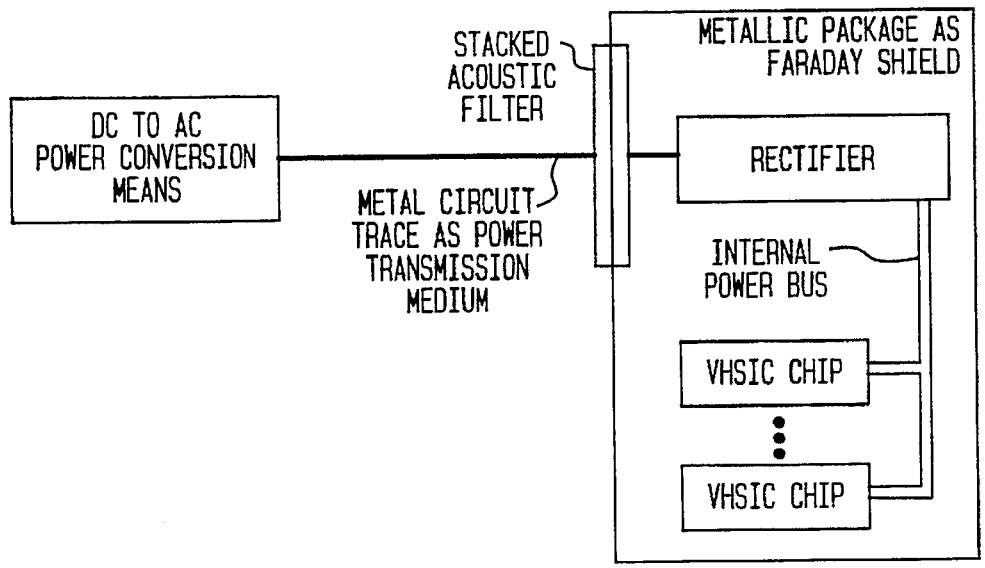
FIG. 8 is an alternate schematic block diagram of the preferred embodiment of a microcircuit package having an HPM-EMI isolator in the power supply line.

FIG. 8 merely depicts the circuitry shown in FIG. 7 in block diagram form.

Signal input/output from and into this type of package could be accomplished optically so as not to introduce any conduction paths in the package whereby EMI may enter. In this way an electrically isolated and EMI protected package is realized for single or multichip microcircuit packages. Fiber optic packages, of course, already exist but these packages are not EMI protected because EMI can enter such packages through power path lines. The present invetion solves this problem.

Figure 9A:
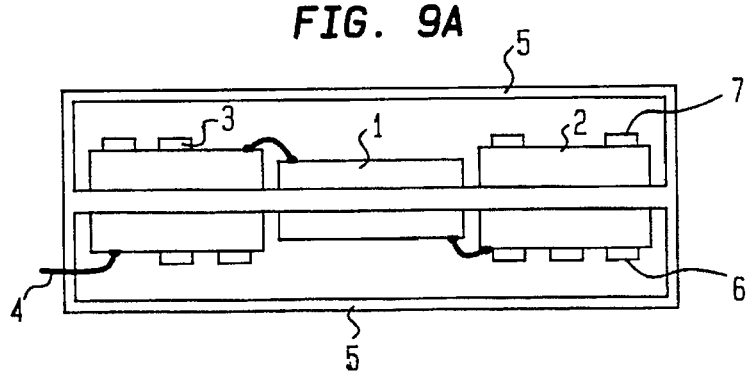
FIG. 9A is an elevation in section taken on the line 9A—9A of FIG. 9B and looking in the direction of the arrows.
Figure 9B:
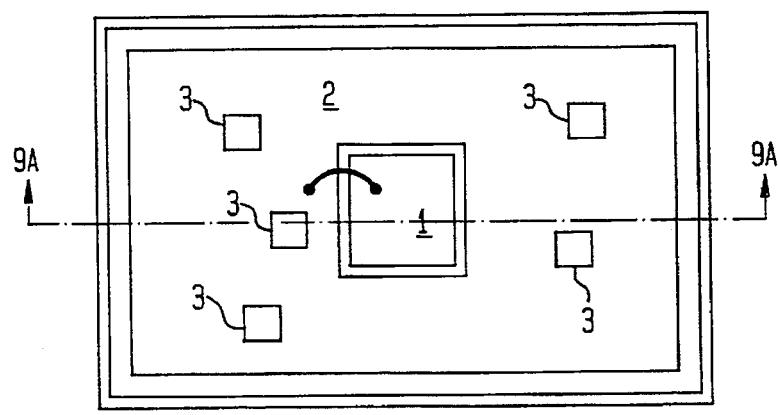
FIG. 9B is a diagram of an alternate embodiment of a microcircuit package having an HPM-EMI isolator in the power supply line.

An alternate design may use a package as illustrated in FIGS. 9a and 9b. The thickness of the package base would correspond, again, to an integral number of half acoustic wavelengths. The PZT plates 100 would be bonded to each side of the base as shown. The substrate 200 would be placed around the PZT plate 100 and contain required circuitry 300, 600 and 700. The DC power for this embodiment is introduced into package 500 via isolation line 400.

It is to be understood that other features are unique and that various modifications are contemplated and may obviously be resorted to by those skilled in the art. Therefore, within the scope of the appended claims, the invention may be practiced otherwise than as specifically described.

What is claimed is:

1. A microcircuit package for isolation against high power microwave energy electromagnetic interference comprising:

an acoustically permeable, conductive barrier disposed as part of a conductive housing, the conductive housing having an outside and an inside;

a d.c. power source disposed outside the conductive housing;

means to convert d.c. power to a.c. power connected to the d.c. power source;

means to convert a.c. power to d.c. power;

at least a first and second planar piezoelectric plates mounted such that the first planar piezoelectric plate is mounted on the outside of the housing at the acoustically permeable barrier and is electrically connected to the d.c. to a.c conversion means and such that the second planar piezoelectric plate is oppositely mounted inside the housing and is electrically connected to the a.c. to d.c. conversion means;

integrated circuit means electrically connected to said a.c. to d.c. conversion means; and data transmission and reception means electrically connected to the integrated circuit for providing an input signal to the integrated circuit means;

wherein said first planar piezoelectric plate converts a.c. power to acoustic power and the acoustic power then propagates across the acoustically permeable, conductive barrier;

wherein said barrier has a thickness which is greater than the first and second planar piezoelectric plates and is substantially equal to a multiple of one half the wavelength of said acoustic power;

and wherein said second planar piezoelectric plate converts the acoustic power propagating across the barrier back to a.c. power.

2. The microcircuit of claim 1 wherein said barrier is a grounded conductor.

3. The microcircuit package of claim 2 wherein said barrier is rigid and heavily loaded.

4. The microcircuit package of claim 3 wherein said barrier is selected from the group consisting of silver (Ag), aluminum (Al), brass, copper (Cu), Kovar, nickel (Ni), and steel.

* * * * *